(12) United States Patent
Krahne et al.

(10) Patent No.: US 10,160,906 B2
(45) Date of Patent: Dec. 25, 2018

(54) MASKED CATION EXCHANGE LITHOGRAPHY

(71) Applicant: FONDAZIONE ISTITUTO ITALIANO DI TECNOLOGIA, Genoa (IT)

(72) Inventors: Roman Krahne, Genoa (IT); Karol Miszta, Stoczek Lukowski (PL); Andrea Toma, Genoa (IT); Fanny Greullet, Genoa (IT); Sergio Marras, Campomorone (IT); Mirko Prato, Chiavari (IT); Milena Arciniegas, Genoa (IT); Liberato Manna, Genoa (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 513 days.

(21) Appl. No.: 14/630,645

(22) Filed: Feb. 24, 2015

(65) Prior Publication Data

US 2016/0246177 A1 Aug. 25, 2016

(51) Int. Cl.
| | | |
|---|---|---|
| *C09K 11/88* | (2006.01) | |
| *B82Y 40/00* | (2011.01) | |
| *G03F 7/004* | (2006.01) | |
| *G03F 7/038* | (2006.01) | |
| *G03F 7/26* | (2006.01) | |

(52) U.S. Cl.
CPC ............ *C09K 11/881* (2013.01); *B82Y 40/00* (2013.01); *C09K 11/88* (2013.01); *G03F 7/0047* (2013.01); *G03F 7/038* (2013.01); *G03F 7/265* (2013.01)

(58) Field of Classification Search
CPC . B32B 3/00; G03F 7/00; G03F 7/0002; G03F 7/0005; G03F 7/004; G03F 7/0042; G03F 7/0043; B82Y 40/00; C09K 11/88; C09K 11/881
See application file for complete search history.

(56) References Cited

U.S. PATENT DOCUMENTS

| | | |
|---|---|---|
| 2003/0145779 A1 | 8/2003 | Alivisatos et al. |
| 2005/0054004 A1 | 3/2005 | Alivisatos et al. |
| 2005/0211154 A1 | 9/2005 | Alivisatos et al. |
| 2010/0233434 A1* | 9/2010 | Lahav .................... B82Y 10/00 428/156 |
| 2011/0284820 A1 | 11/2011 | Kudera et al. |
| 2012/0201265 A1 | 8/2012 | Krahne et al. |
| 2013/0032767 A1 | 2/2013 | Manna et al. |
| 2014/0170383 A1 | 6/2014 | Miszta et al. |

OTHER PUBLICATIONS

Patterning micron-sized features in a cross-linked poly(acrylic acid) film by a wet etching process, Winkleman et al., Soft Matter, 2007, 3, 108-116.*
Writing on Nanocrystals: Patterning Colloidal Inorganic Nanocrystal Films through Irradiation-Induced Chemical Transformations of Surface Ligands, Palazon et al., J. Am. Chem. Soc., 2017, 139 (38), pp. 13250-13259.*
Miszta et al. "Nanocrystal film patterning by inhibiting cation exchange via electron-beam or X-ray lithography" *Nano Letters*, vol. 14, No. 4, pp. 2116-2122 (Mar. 2014).

* cited by examiner

*Primary Examiner* — Haidung D Nguyen
(74) *Attorney, Agent, or Firm* — Nixon & Vanderhye PC

(57) ABSTRACT

We describe a method for patterning of colloidal nanocrystals films that combines a high energy beam treatment with a step of cation exchange. The high energy irradiation causes cross-linking of the ligand molecules present at the nanocrystal surface, and the cross-linked molecules act as a mask for the subsequent cation exchange reaction. Consequently, in the following step of cation exchange, the regions that have not been exposed to beam irradiation are chemically transformed, while the exposed ones remain unchanged. This selective protection allows the design of patterns that are formed by chemically different nanocrystals, yet in a homogeneous nanocrystal film.

10 Claims, 7 Drawing Sheets

MASKED CATION EXCHANGE LITHOGRAPHY

FIELD OF THE INVENTION

The present invention relates to a method for patterning of colloidal nanocrystals films that combines a high energy beam treatment with a step of cation exchange. The high energy irradiation causes cross-linking of the ligand molecules present at the nanocrystal surface, and the cross-linked molecules act as a mask for the subsequent cation exchange reaction. Consequently, in the following step of cation exchange, the regions that have not been exposed to beam irradiation are chemically transformed, while the exposed ones remain unchanged. This selective protection allows the design of patterns that are formed by chemically different nanocrystals, yet in a homogeneous nanocrystal film.

STATE OF THE ART

Colloidal inorganic nanocrystals (NCs) are among the most exploited nanomaterials due to their extreme versatility. They are synthesized directly in the liquid phase and couple the advantage of being made of a core of one or more inorganic materials, which guarantees their structural stability and resistance to degradation, with the additional feature of being coated with a monolayer shell of organic passivating ligands. The ligands passivation of the surface ensures their solubility in a variety of solvents and is at the basis of their ease of processability, as if they were standard macromolecules. An additional step forward in NC research was the creation of a wide range of superstructures from the assembly of such NCs, which can be thought of as new types of artificial solids. This, coupled with the possibility to replace the native ligands on the surface of the NCs with shorter molecules, down to single atom ligands, has conferred unique optical and electrical features to films of NCs that make them attractive for low cost alternatives to many technologies in photovoltaics, optics, and electronics. Hand in hand with advances in surface ligand exchange, methods for the fabrication of homogeneous NC films with good thickness control have been developed, for example employing layer-by-layer processes (Luther J. M. et al. *ACS Nano* 2008, 2(2): 271-280; or Ip A. H. et al. *Nat. Nanotechnol.* 2012, 7(9): p. 577-582), in which each step of deposition of NCs was followed by a change of the polarity of the surface through ligand exchange to avoid NC re-dissolution on successive layer deposition. Several efforts have been reported in the prior art to create patterned NC films. For example NC films and patterns by Langmuir Blodgett (LB) can be achieved by modifying the wettability of the surface. Nanoparticle films with control over homogeneity and thickness can be deposited on different substrates, and wire and dot patterns can be achieved by structuring the wettability of the substrate (that is pulled vertically out of the LB trough). The resolution of this technique is tens of nm (slightly worse than EBL), and it does not allow to generate arbitrary patterns like the method of the invention. Furthermore, the patterning relies on regions filled with nanoparticles aside empty regions, whereas the method of the present invention results in a homogeneous film that alternates nanoparticles regions with different composition (Tao A. R. et al. *Acc. Chem. Res.* 2008, 41(12): 1662-1673).

Conventional lithography (patterned resist masks) can also be used to position nanocrystal in defined regions on a surface. This method allows for the deposition of nanocrystals in regions that are defined by structuring trenches into resists or the substrate surface. Arbitrary shapes of nanocrystal assembly patterns can be achieved with high resolution. The nanoparticle regions are separated by resist or the substrate, it does not provide the possibility to interface nanoparticles with different composition using a single lithography step, as in the method of the present invention, and it does not result in a layer with homogeneous morphology (Cui Y. et al. *Nano Lett.* 2004, 4(6): 1093-1098; and Mentzel T. S. et al. *Nano Lett.* 2012, 12(8): 4404-4408).

Dip pen lithography can also be used to deposit nanocrystal patterns from a liquid meniscus of an AFM tip. This method is resist free, can achieve arbitrary patterns with some tens of nm resolution, but as above, it does not provide the possibility to interface nanoparticles with different compositions using a single lithography step, as in the method of the present invention, and it does not result in a layer with homogeneous morphology (John Thomas P. et al. *J. Materials Chem.* 2004, 14(4): 625-628).

Doctor blading allows for the fabrication of homogeneous, self-assembled layers over large areas, but with no patterning of such layers (Bodnarchuk M. I. et al. *ACS Nano* 2010, 4(1): 423-431).

Alternatively, ink-jet printing of polymer-nanocrystal composites can be used to obtain solution-based deposition of composite nanomaterials with micron resolution. This method does not allow to deposit "pure" NC films, does not provide nanoscale resolution and the pattern consists of filled and empty spaces. In contrast, the method of the present application fabricates a homogenous film consisting solely of nanocrystals, and allows for higher resolution patterns consisting of nanocrystals with different composition (Tekin E. et al. *Adv. Functional Materials* 2007, 17(1): 23-28).

Finally, in electron-beam writing on nanocrystal films, high energy electron beams were used to increase the cohesiveness and adhesion to the surface of nanoparticle films. The unexposed areas were removed by washing steps. This method relies also on the modification of the surface ligands by electron-beam exposure, but again produces patterns that consists of filled an empty spaces, and is not able to produce different materials in the same layer (Bedson T. R. et al. *Applied Phys. Lett.* 2001, 78(13): 1921-1923; Nandwana V. et al. *J. Materials Chem.* 2011, 21(42): 16859-16862).

Scope of the present invention is to overcome the limits and drawbacks of the previous technologies and to avail an improved method to pattern nanocrystals or nanoparticles films.

SUMMARY OF THE INVENTION

The present invention is based on the observation that high energy irradiation causes cross-linking of the ligand molecules present at the nanocrystal surface, and the cross-linked molecules act as a mask for any subsequent chemical modification of the treated areas, so producing a local inhibition of, for example, cation exchange reactions. Consequently, in a subsequent step of cation exchange, which is performed by contacting the substrate with a solution containing the new different cation, the regions that have not been exposed to the electron beam are chemically transformed, while the exposed ones remain unchanged.

Accordingly, the first object of the present invention is a method for preparing a patterned homogeneous nanocrystal film comprising the steps of:

providing an homogeneous film of nanocrystals coated on their surface with an organic surfactant ligand, deposited on a solid support, said nanocrystals comprising a first cation;

crosslinking the organic ligand on the surface of the nanocrystals by exposing the film to a high energy irradiation beam along a predefined pattern;

subjecting the so treated film to a cation-exchange reaction with a solution of a chemical species releasing a second cation different from the first cation, whereby obtaining a morphologically homogeneous nanocrystals film comprising said second cation, with patterns of nanocrystals comprising said first cation.

A second object of the invention is the nanocrystal film obtained by the method of the invention, said film being homogeneous and comprising patterns of nanocrystals, which are chemically different from the nanocrystals forming the film.

A further object of the invention is the use of the patterned nanocrystals film according to the invention to fabricate luminescent patterns (pixels), conductive wires and electrical circuits in a homogeneous film or optoelectronic elements.

The present invention offers many advantages. It allows to chemically transform selected regions of arbitrary shapes in an otherwise homogeneous NC film. The masked cation exchange process is suitable to fabricate luminescent patterns and electrical circuits in NC films without altering their morphology, adding new versatility to these materials. Other advances in this direction are brought about by the high resolution that can be achieved in designing patterns. The claimed method also enables performing several cation exchange steps and therefore the assembly of several different materials in a single film. Finally, the masked cation exchange technique has the potential to integrate miniaturized opto-electronic elements, for example on well-defined areas on a microchip, offering a possible new technology for future integrated circuits.

DETAILED DESCRIPTION OF THE INVENTION

Figure 1:
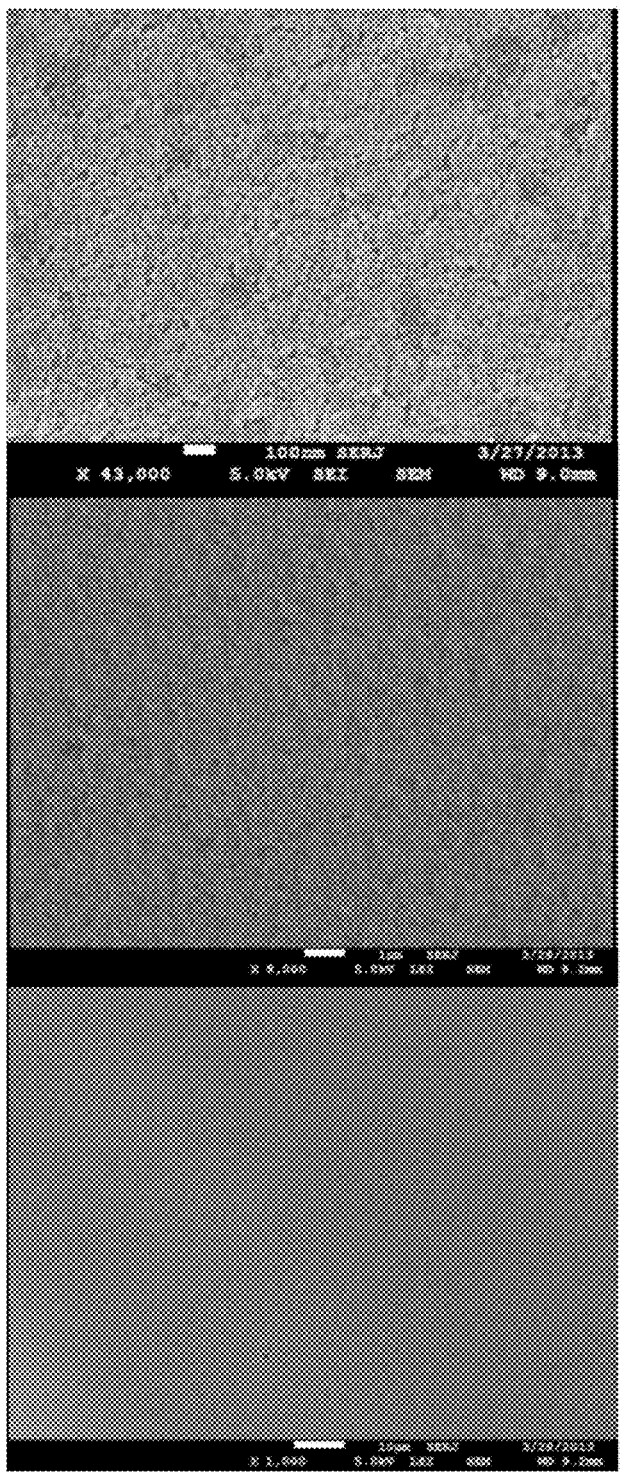
FIG. 1. Illustrations of SEM images of CdSe/CdS nanocrystal films at different magnifications, so demonstrating their homogeneity over large areas.

The first step of the process of the invention consists in providing a homogeneous film of nanocrystals. For the purpose of the present invention "homogeneous film" firstly means a film homogeneously layered or distributed on a solid support. The film is a continuous film, without gaps or alternation of filled and empty spaces or alternation of nanocrystal material and non-nanocrystal resists. The homogeneous film demonstrates, upon SEM analysis at different magnifications, homogeneity over a reasonable or large area, as illustrated in FIG. 1.

Yet, the "homogeneous" character of the film also implies "morphological homogeneity", that means: homogeneity in the crystalline shape, such as for example nanospheres, octahedra, truncated octahedra, nanoplatelets, nanorods, nanosheets, nanostars, branched or core/shell nanostructures and homogeneity in the crystalline structure, such as for example, monoclinic, triclinic, cubic, tetragonal, trigonal, hexagonal, orthorhombic.

Importantly, the homogeneous character of the produced film does not imply the chemical homogeneity. In fact, the produced nanocrystals film comprises patterns of nanomaterial chemically different from the surrounding areas, this type of dishomogeneities being immaterial to the morphologically homogeneity of the film. The different chemical structure of film and patterns motifs derives from the cation exchange step of the claimed method. It has recently been demonstrated that chemical transformations in nanostructures, via cation exchange, involves replacement of the sub-lattice of cations in a crystal with a new sub-lattice of different cations, without affecting the anion sub-lattice. For this reason, the anion framework remains stable even in more elaborate structures, such as core/shell structures and the overall shape and morphology of the NCs is usually preserved. Moreover, the cations from the starting NCs can either be replaced in its entirety or they can be partially replaced.

The colloidal nanocrystals used to produce the homogeneous film and comprising a first cation are any type of nanocrystals capable of generating a film. In one embodiment of the invention, the nanocrystals consist in crystalline metal chalcogenides, or metal oxides, or metal halides, or metal nitrides, or metal phosphides, or metal arsenides, or mixture thereof. In another embodiment of the invention, the nanocrystals comprising the first cation are nanocrystals of a material selected from a group III-V semiconductor, a IV-VI semiconductor, a II-VI semiconductor, or one material not comprised in the above groups selected from $Cu_2Se$, $Cu_{2-x}Se$, $Cu_{2-x}Se_{1-y}S_y$, $Cu_2S$, $Cu_{2.86}Te$, $Ag_2Se$, $AgSe$, $Ag_2S$, $Ag_2Te$, $CoSe$, $CoSe_2$, $CoS_2$, $CoTe_2$, $Co_3Se_4$, $Co_3S_8$, $ZnSO_4$, $SeS$, $MnSe$, $MnSe_2$, $MnS$, $MnSe_2$, $MnTe_2$, $MnS_{1-y}Se_y$, $MnSe_{1-y}Te_y$, $SiC$ (3C), $SiGe$, $CuIn_{1-x}Ga_xSe_2$, $Zn_3As_2$, $Li_3NbO_4$, $La_2CuO_4$, $Ga_4Se_8$, $Ga_{1.33}Se_2$, $Mn_xIn_{1-x}As$, $Cd_xMn_{1-x}Te$, $Mn_{0.4}Pb_{3.6}Te_4$, $CuIn_xGa_{1-x}Se_2$, $CuInSe_2$, $Ag_{0.28}Ga_{2.56}S_4$, $YF_3$.

Preferred nanocrystals are selected from group II-VI semiconductors such as CdS, CdSe, CdTe, ZnS, ZnSe, ZnTe and from copper chalcogenides, such as $Cu_{2-x}S$, $Cu_{2-x}Se$, $Cu_{2-x}Te$.

The nanocrystals making the homogeneous film may have the following crystalline shape: nanospheres, octahedra, truncated octahedra, nanoplatelets, nanorods, nanosheets, nanostars, branched, and exhibit the following crystalline structure: monoclinic, triclinic, cubic, tetragonal, trigonal, hexagonal, orthorhombic. They can also have a layered compositions, that is, they can be made of layers, grown on top of each other, of different compositions, as in an onion-like structure: core/shell, core/shell/shell, core/shell/shell shell, etc.

The colloidal nanocrystals forming the film are coated on their surface with an organic surfactant ligand or a mixture thereof. For the purpose of the present invention, the word "coated", indicates that the surface of each nanocrystals is individually coated by a layer, preferably a monolayer, of the organic surfactant molecules that are normally, though not necessarily, used in the synthesis to grow the nanocrystals, or other types of molecules with which the organic surfactant were changed after the synthesis, or that the nanocrystals are cumulatively embedded within a matrix of such molecules.

The organic surfactant ligands suitable for the present invention are any carbon chain-based surfactant molecule capable of cross-linking, specifically the native organic ligands used in the nanocrystals preparation process to passivate their surface. Yet, molecules not capable of cross-linking or small molecule, such as hydrazine, single atomic ligands (such as $S^{2-}$, $Cl^-$, $Br$, etc), or zintl anions, that do not contain carbon atoms, are useless as surfactant ligands for the purpose of the present invention.

Examples of suitable surfactants are those selected from the group comprising alkylphosphines, alkylphosphine-oxides, alkylphosphonic acids, alkylamines, alkylthiols, fatty carboxylic acids or fatty alkanes, fatty alkenes, arenethiols, aromatic compounds and ethers or mixture thereof. The alkyl moiety is a C6-C38 saturated or unsaturated carbon chain such as C8, C10, C12, C14, C16, C18, C20, C24, C24, C26 or C30.

Specific examples are: trioctylphosphine (TOP), trioctylphosphine oxide (TOPO), octadecylphosphonic acid (ODPA), hexylphosphonic acid (HPA), oleylamine (OLAM), hexadecylamine, 1-dodecanethiol, 1-hexadecane thiol, cathecol, oleic acid (OLAC), stearic acid, arenethiolate.

For instance, $Cu_{2-x}Se$ nanocrystals may suitably be dissolved in trioctylphosphine (TOP). Equally, $Cd^{2+}$ ions are suitably used in the form of cadmium alkylphosphonates, for example a mixture of hexyl- and octadecyl-phosphonate in trioctylphosphine oxide (TOPO), or in the form of cadmium oleate, or cadmium stearate.

The colloidal nanocrystals are deposited on a solid support. Any suitable technology to layer a homogeneous film of nanocrystals can be used in this step. The nanocrystals are firstly dispersed in a solvent and the so obtained dispersion stabilized by the surface ligands. The stabilized dispersion is then deposited to form the homogeneous NC film on a substrate, using techniques well-known to the skilled person, for example by spin coating, layer-by-layer deposition, by slow solvent evaporation, Langmuir-Blodgett, capillary-jet deposition, ink-jet printing, dip-pen lithography, drop-casting, doctor-blading, nanocrystal film self-assembly at liquid subphases.

To prepare the dispersion, the nanocrystals, coated at their surface with the stabilizing ligands are suspended in any suitable organic solvent such as for example: toluene, chloroform, hexane, pyridine, dichloroethane, tetrachloroethane, dimethylformamide, dimethylsulfoxide, dichlorobenzene. The concentration of the solid materials (nanocrystals) in the dispersion is comprised from $10^{-10}$ to $10^{-6}$ molar in nanocrystals.

The solid support or substrate can be any planar material that can support a thin nanocrystal film, for example: $Si/SiO_2$ or $Si/Si_3N_4$, glass slides, carbon coated copper grids, graphene coated substrates, flexible plastic substrates such as for example polyester (PET), polyimide (PI), polyethylene napthalate (PEN), polyetherimide (PEI), along with various fluropolymers (FEP) and copolymers polyimide films.

By way of example, the NC films, with thickness of few monolayers, were spin-coated from a toluene solution onto $Si/SiO_2$ substrates. The uniformity of the obtained NC films even over large areas is clearly seen in FIG. 1.

Alternatively, the film can be generated employing layer-by-layer processes, in which each step of deposition of the nanocrystal is followed by a change of the polarity of the surface through ligand exchange to avoid NC re-dissolution on successive layer deposition.

The so obtained homogeneous nanocrystals film is then submitted to high energy irradiation, for example electron beam or X-ray beam, preferably electron beam lithography, in order to obtain the necessary nanocrystal-masking effect, which prevents the flow of cations in the subsequent cation exchange reaction. The irradiation-treatment is used to directly write arbitrary pattern-motifs on the nanoparticles film surface. Irradiation modifies the structure of the ligands on the NC surface, presumably leading to ligand crosslinking or polymerization. As a result, the irradiated NCs are anchored to the substrate and linked to each other, while particles in the non-irradiated regions remained unaffected and prone to be removed or transformed during the subsequent cation-exchange step.

Without wishing to bind the invention to any specific theory, electron-beam or X-ray irradiation of linear alkanes seem to cause loss of orientational and conformational order, cleavage of C—H bonds, and partial dehydrogenization leading to carbon double bond formation, as well as desorption of layer fragments. Also, the irradiation-induced effects were found to be essentially independent of the alkyl chain length and of the substrate material.

Only by way of example, when the irradiation is obtained with an electron-beam using a lithography system, the system offers a high resolution of around 50-100 nm, but it can move down to resolutions of less than 10 nm. The system may suitably be employed with an acceleration voltage of 10 kV and an exposure dose in the range of 0.1-20 $mC/cm^2$, preferably 1-15 $mC/cm^2$, more preferably 2-10 $mC/cm^2$.

In order to mask the nanocrystals film and to inhibit the cation exchange process, the NC films can also be exposed by UV or deep-UV lithography, for example using a maskaligner, laser writer, or laser stepper. Suitable exposure sources are the i-line at 365 nm, or the lowest line of high-pressure mercury lamps at 254 nm.

Always in order to mask the nanocrystals film, the NC films can also be exposed to X-ray irradiation, for example from a synchrotron radiation source (ELETTRA). Suitable X-ray doses are in the range 1-40 kJ/cm$^2$, preferably 30 kJ/cm$^2$. The masking-effect of the NCs with X-ray evidences that the cross-linking of the surface ligands was indeed at the origin of the masking. It is in fact well-known that X-ray exposure leads to polymerization of organic molecules and does not result in the deposition of a carbon layer on the surface of the sample, as e-beam exposure does.

In the cation exchange step, the NC film regions that have not been exposed to electron beam or X-ray beam are chemically transformed, in that the sub-lattice of cations in the crystals are replaced by a new sub-lattice of different cations.

The cation exchange step is performed by contacting the nanocrystals of the film, comprising a first cation, with a solution of a second cation. The contacting may occur, for instance, by immersion of a film sample into the solution of the second cation, under the usual and well known operative condition. For example the contacting time ranges from 5 seconds to several hours, usually at room temperature, but also at elevated temperatures in the range from 20-100° C. The solution of the second cation may be an aqueous, a hydro-alcoholic or an alcoholic solution.

The second cation is provided as the cationic moiety of any compound capable of releasing the cation when put in solution, such as chelating agents, salts or complexes. Examples of these compounds are: Cu(I) tetrakis (acetonitrile) hexafluorophosphate, Cu(I) halides (e.g. CuCl, CuBr, CuI), Cd halides (e.g. $CdCl_2$, $CdBr_2$, $CdI_2$), Hg halides (e.g. $HgCl_2$, $HgBr_2$, $HgI_2$).

The second cation is preferably selected from the elements belonging to group III, group IV and to the transition metal group of the periodic system. In particular the second cation is selected from the group comprising the cationic form of Cu, Ag, Co, Zn, Se, Mn, Si, Li, La, Cd, Ga, Pb, Y, having a valence comprised between 1 and 4.

In order to obtain the replacement of the first cation in the film by the second cation, the concentration of the second cation in the solution has to be at least stoichiometrically equivalent to the amount of the first cation atoms in the film. Yet an excess of second cation is used to ensure full replacement of the cations in the unexposed areas of the NC films. For example, the amount of the second cation-releasing compound in the solution may exceed the amount of first cation atoms in the film by several orders of magnitudes.

After cation exchange, the so treated film may be washed to remove all excess of chemical species with an alcoholic solution.

In a specific embodiment of the invention, the cation exchange reaction comprises sequential exchange reactions, in which the first cation in the film is replaced by a second cation and this exchanged again by a third different cation, as detailed in Example 3.

The present invention finds application in the realization of conductive circuits in NC films, to create luminescent patterns in NC films, to fabricate electronic and optoelectronic elements, and for optical and chemical sensors, specifically for chemical species in fluid or gas medium.

In the following section, the invention will be described by way of examples of actual realisation. The section has however no limiting effect on the scope of protection. In this experimentation, CdSe, CdS, and core-shell CdSe/CdS NCs were used as exemplifying starting materials, which were dispersed in toluene and stabilized by native surface ligands.

Example 1

Nanocrystal Synthesis

CdSe nanocrystals (protocol as published by Talapin D. V. et al. *Chem. Rev.* 2010, 110(1): 389-458): TOPO (3.0 g), ODPA (0.280 g) and CdO (0.060 g) were mixed in a 50 ml flask, heated to ca. 150° C. and exposed to vacuum for ca. 1 hour. Then, under nitrogen, the solution was heated to 370° C. to dissolve the CdO until it turned optically clear and colorless. At this point, 1.5 g of TOP was injected in the flask and the temperature was allowed to recover, followed by the injection of the Se:TOP solution (0.058 g Se+0.360 g TOP). After the synthesis, the nanocrystals were washed by addition of methanol, precipitated, and redispersed in toluene.

CdS nanorods: 50 mg of Cadmium oxide (CdO), 10 mg of cadmium chloride ($CdCl_2$), 280 mg of octadecylphosphoric acid (ODPA), 80 mg of hexcylphosphonic acid (HPA), and 3 g of trioctylphosphine oxide (TOPO) were loaded in a reaction flask and then heated to 120° C. under vacuum for 1 h. Nitrogen was then pumped into the reaction mixture, and the temperature was raised to 380° C. Then 2 ml of trioctylphosphine (TOP) were added when the mixture reached the set temperature, after which 0.5 g of S:TOP (100 mg of S and 1 mL of TOP) were injected rapidly into the reaction flask when temperature recovered to 380° C. The reaction time was 10 min. The final product was washed by addition of methanol, precipitation and re-dispersion in toluene.

Core-shell CdSe/CdS NCs (protocol as published by Vanmaekelbergh D. et al. *Chem. Soc. Rev.* 2005, 34(4): 299-312): 10-7 moles of CdSe seeds (average size 5.5 nm, concentration 25 µM) was dissolved in 10 ml of octadecene (ODE) and introduced into a three necked flask. The solution was degassed under vacuum to 120° C. for 1 hour. Then Ar gas was introduced in the flask and the temperature was raised up to 300° C., followed by the injection of a solution containing Cd oleate (60 mg), and the sulphur precursor (TOP:S) in ODE.

The solution was introduced stepwise by a syringe pump and the reaction went on for 4 hours. The particles were then precipitated by addition of isopropanol and centrifugation (at 3000 rpm), and were finally dispersed in toluene.

Example 2

Preparation of the NC Film and Cation Exchange 2.1. Deposition on Solid Substrate Homogeneous NC films were deposited on a substrate, for example, by spin coating or via layer-by-layer deposition. The NC films with thickness of few monolayers, were spin-coated from a toluene solution onto Si/$SiO_2$ substrates. In detail, 15 µL of NC solution at a concentration of 2 µM was deposited on previously cleaned Si/$SiO_2$ substrates, already mounted in the spin coater, and after 2 min the sample was spun at 2500 rpm for 4 min. The uniformity of the obtained NC films even over large areas is clearly seen in FIG. 1.

2.2. Irradiation

In the next step, the NC films were exposed to an electron-beam using a Raith 150-two lithography system, with an acceleration voltage of 10 kV and an exposure dose in the range of 0.1-20 mC/cm$^2$.

2.3. Cation Exchange

In this example, CdSe/CdS NCs were converted to $Cu_{2-x}Se/Cu_{2-x}S$ following published cation exchange procedures (Jain P. K. et al. *J. Am. Chem. Soc.* 2010, 132(29): 9997-9999; Miszta K. et al. *ACS Nano* 2011, 5(9): 7176-7183; Li H. et al. *ACS Nano* 2012, 6(2): 1637-1647). This material system has the advantage that the CdSe/CdS NCs have a bright photoluminescence (PL) in the visible region that can be easily detected via confocal imaging, while $Cu_{2-x}Se/Cu_{2-x}S$ NCs are not emitting in this spectral range. Therefore spatial imaging of the PL is a convenient and non-invasive tool to reveal the NC transformation in the film. Furthermore, $Cu_{2-x}Se/Cu_{2-x}S$ NC films had an appreciable conductivity, while the CdSe/CdS NC films were not conducting current within the detection limit of 1 pA (this is true for NC coated with their native surfactants, which are mainly alkyl phosphonic acids).

Cation exchange on the NC films was performed by immersion of the samples in 5 mL of a solution of a Cu(I) complex (namely, Cu(I) tetrakis (acetonitrile) hexafluorophosphate) in methanol (60 mg/mL) for 45 min. An excess of copper complex was used to ensure full replacement of the cations in the unexposed areas of the NC films. The amount of Cu(I) in the solution exceeded the amount of Cd atoms in the film by several orders of magnitude. After exchange, the samples were immersed in methanol twice, for 30 min each, to remove excess copper/cadmium species from the surface of the film.

2.4. Results

Experimental data from a NC film region where a row of squares was exposed with different e-beam doses, increasing from 1 to 7 mC/cm$^2$ showed that exposed squares could be distinguished in backscattered electrons (BSE) SEM images because regions exposed to a high e-beam dose had brighter contrast than regions exposed to a comparatively lower dose. The brighter contrast correlates with greater average Z in the CdSe/CdS regions as compared to the $Cu_{2-x}Se/Cu_{2-x}S$ ones. The observed dark contrast of the squares with comparatively low exposure dose results from carbon deposition. The absence of PL from these squares indicates that the e-beam induced modification of the surface ligands was not sufficient to prevent the cation exchange reaction. The strong PL originating from the exposed regions with high e-beam dose is an indicator of successful masking from cation exchange, since this bright emission in the visible can only originate from CdSe/CdS NCs. Additionally the wavelength of the emission from the protected regions was not affected by the process, demonstrating that the electronic structure of the NCs was not modified by the overall process (see FIG. 2).

The impact of the e-beam exposure on the mechanical behavior of the films was also investigated by nanoindentation, using a CSM UHNT indenter (Example 3). Comparison of the P-h curves recorded from exposed and unexposed regions showed significantly increased hardness and lower penetration depth in the exposed region, as demonstrated in FIG. 3. This behavior can be explained by a change in the deformation mechanism as follows: in the unexposed film the collective response of the NCs is that of a granular material, which is driven by sliding motion of the particles. Upon e-beam exposure, the deformation mechanism is similar to that of a polymer-based composite material, in which the sliding motion of the particles is inhibited by the cross-linking of the surfactant molecules of adjacent NCs. Therefore the increase in hardness supports cross-linking of the surfactant molecules by e-beam exposure.

Figure 4:
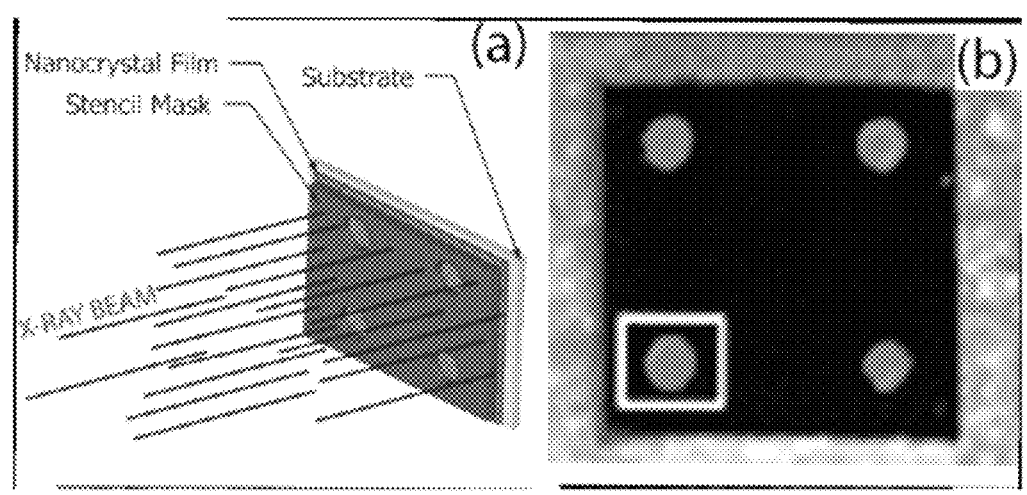
FIG. 4. (a) Sketch illustrating the X-ray exposure experiment of the NC film, via a stencil mask with four circular holes, which was carried out at the DXRL beamline of the Elettra synchrotron facility. (b) Optical fluorescence image recorded under UV illumination of a NC film that was exposed to X-ray radiation with a dose of 30 kJ/cm2, followed by cation exchange, as described in the text. The four spots correspond to the layout of the stencil mask used for the exposure.

Moreover, in order to assess X-ray effects, circular patterns, defined by a metallic stencil mask in a core-shell CdSe/CdS NC films, were exposed to a beam with 30 kJ/cm$^2$ intensity. The successful masking of the exposed areas was verified by fluorescence microscopy and EDS mapping of Cu and Cd, as shown in FIG. 4a. Optical fluorescence image was recorded under UV illumination of a NC film that was exposed to X-ray radiation, followed by cation exchange, as described in the text. The four spots in FIG. 4b correspond to the layout of the stencil mask used for the exposure.

2.5. Characterisation of the Obtained Films

2.5.1. Optical Properties of CdSe/CdS and $Cu_{2-x}Se/Cu_{2-x}S$ NCs

Figure 5:
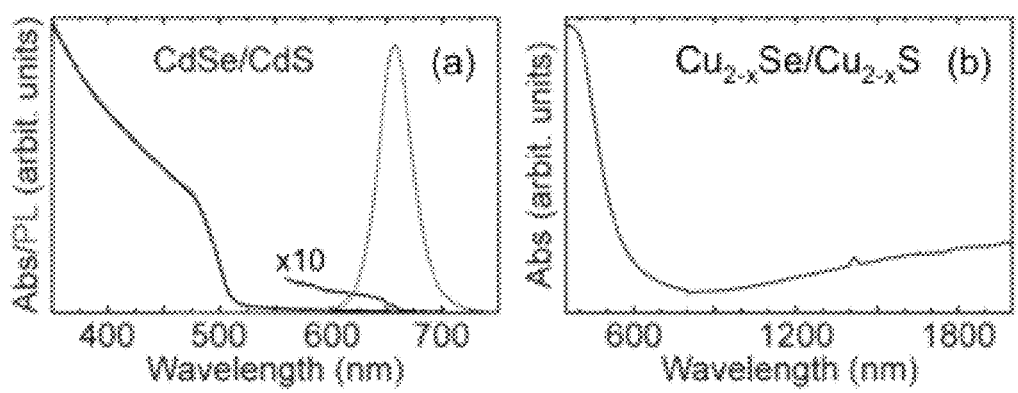
FIG. 5. Optical absorbance of a pristine (a) and cation-exchanged (b) NC sample recorded from solution.

FIG. 5 shows the optical absorbance of a pristine (FIG. 5a) and cation-exchanged (FIG. 5b) NC sample recorded from solution. The absorption spectrum of the pristine NCs is dominated by the CdS shells and the dotted line depicts the magnified (×10) absorbance underlining the absorption edge of the CdSe cores. The emission of the CdSe/CdS NCs is shown by the line on the right hand in FIG. 5a, and was recorded with an excitation wavelength of 450 nm.

2.5.2. X-Ray Photoelectron Spectroscopy

Figure 6:
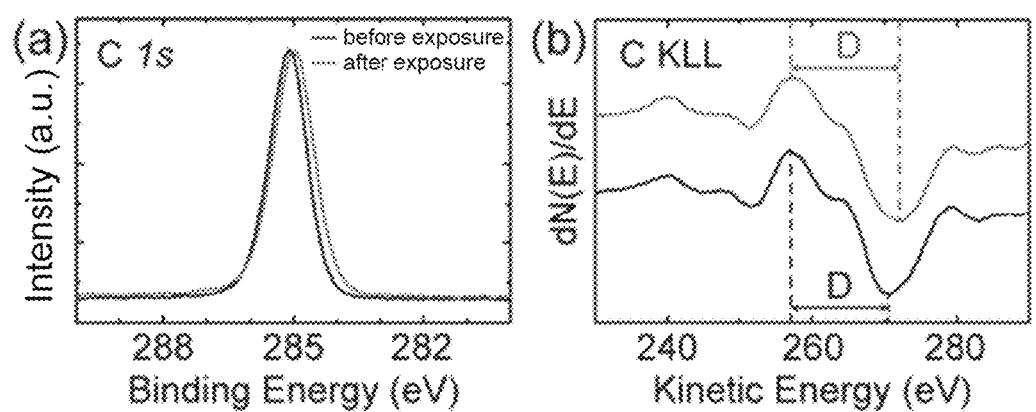
FIG. 6. XPS spectra recorded from NC films before and after e-beam exposure at 6 mC/cm$^2$. (a) Carbon C 1s spectrum, (b) first derivative of the X-ray-induced C KLL spectra.

FIG. 6 shows the XPS spectra recorded from NC films before and after e-beam exposure at 6 mC/cm$^2$: Carbon C 1s spectrum (FIG. 6a) and first derivative of the X-ray-induced C KLL spectrum (FIG. 6b). The indicated D-parameter relates to sp2 content and clearly evidences increased C=C crosslinking after e-beam exposure. The binding energy scale in each spectrum was calibrated with Cd $3d_{5/2}$ line of 405.3 eV, i.e. to the reported average value for CdS.

Figure 2:
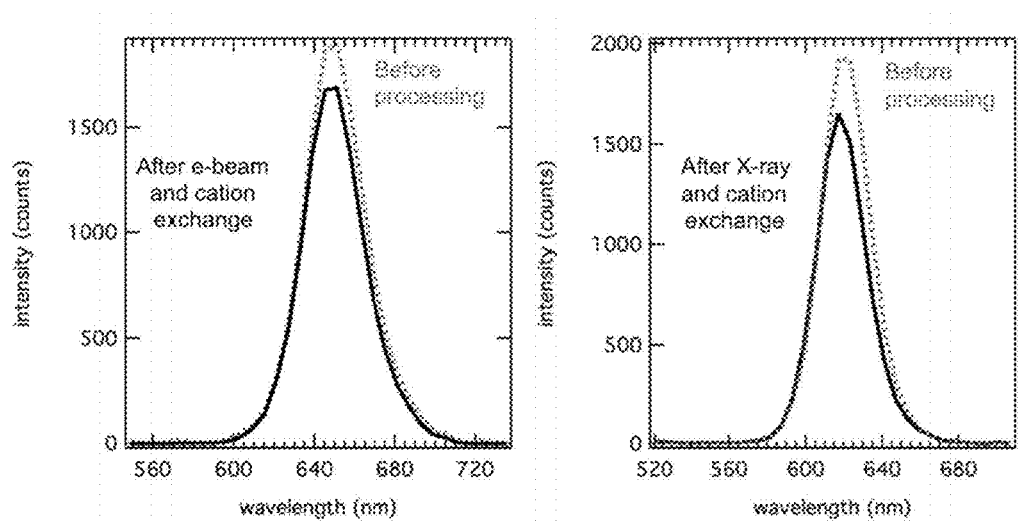
FIG. 2. Photoluminescence spectra recorded from the protected region of the NC film before (dashed) and after e-beam or X-ray exposure and cation exchange treatment (solid), demonstrating that the PL wavelength is conserved. Two different samples of CdSe/CdS NCs were used for the two experiments (e-beam and X-ray lithography, respectively).

2.5.3. Emission Recorded Before and after Cation Exchange from Regions Protected by e-Beam and X-Ray Irradiation FIG. 2 illustrates the photoluminescence spectra recorded from the protected region of the NC film before (dashed-line) and after (solid-line) e-beam or X-ray exposure and cation exchange treatment, demonstrating that the PL wavelength is conserved. Two different samples of CdSe/CdS NCs were used for the two experiments (e-beam and X-ray lithography, respectively).

2.6. Mechanical Response of the Films by Loading-Unloading Tests on Both Exposed and Nonexposed Regions on the Samples.

Figure 3:
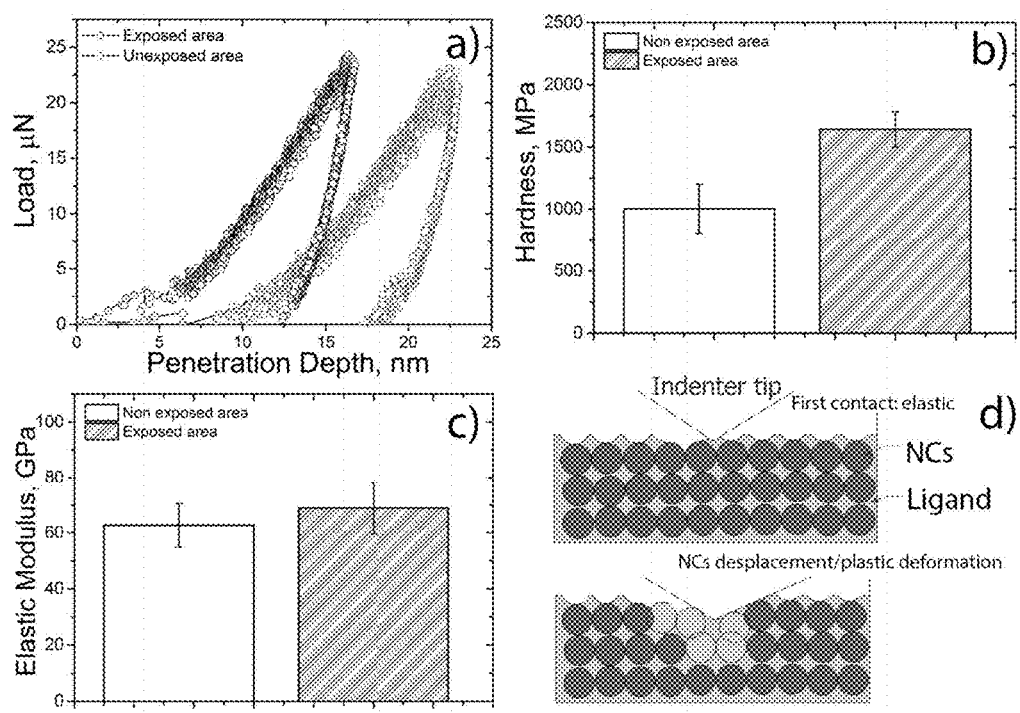
FIG. 3. (a) Representative P-h curves obtained from monotonic nanoindentation tests with a Berkovich tip on nanocrystal films patterned by e-beam exposure. (b-c) Mean hardness and elastic modulus values calculated for the exposed and unexposed areas. (d) Cartoon showing the sequence of the first stages of the deformation that occurred on the film as a composite structure.

Instrumented indentation measurements were performed on NC films patterned by e-beam exposure, thus on regions that were exposed by e-beam and on unexposed regions. In both cases, nine monotonic tests of loading and unloading were conducted at constant temperature of 22.0±0.5° C. The measurements were carried out using a Berkovich tip with a calibrated tip rounding of approx. 10 nm. On each test, the load linearly increased from 0 to 25 µN. Here the maximum load was limited to 25 µN to keep the penetration depth <30 nm, thereby reducing the influence of the silicon substrate on the measurements. The load applied (P) and indentation depth (h) were recorded throughout the tests, and the elastic response was measured during unloading. The Young's modulus was calculated using the Oliver and Pharr method. Concerning hardness and Young modulus we note that the low thickness of the film led to unrealistically high values. FIG. 3 shows a representative P-h curve for each area studied. FIG. 3a shows that the penetration depth is higher for unexposed regions as compared to exposed ones, revealing the hardening of the film caused by e-beam exposure. FIGS. 3b and 3c depict the mean values obtained for the hardness and the elastic modulus. The sequence of loading the composite structure is illustrated in FIG. 3d.

Example 3

Masked Cation Exchange in CdSe Nanocrystal Films

Figure 7:
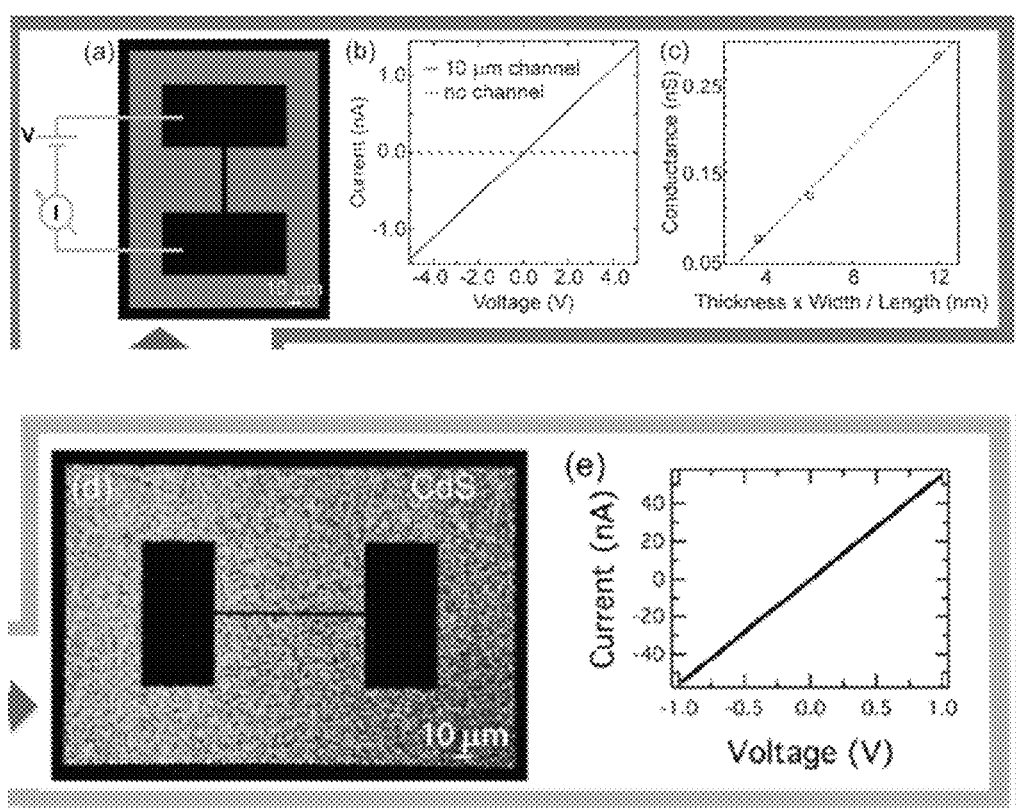
FIG. 7. Electrical circuit pattern defined by the masked cation exchange process: (a) Confocal image of a two pads connected by a wire consisting of $Cu_{2-x}Se/Cu_{2-x}S$ NCs, embedded in a CdSe/CdS NC film. (b) Current-voltage (I-V) characteristics measured from two not-connected pads (dashed line) and two connected pads (solid line) as shown in a. (c) Conductance of $Cu_{2-x}Se/Cu_{2-x}S$ NC wires with different lengths and widths (film thickness of 100 nm was kept constant). The dashed line is a linear fit, which slope relates to the conductivity of the cation-exchanged NC film. (d) Confocal image of wire connecting two pads consisting of $Cu_{2-x}S$ NCs in a CdS NC film. (e) I-V recorded from the wire displayed in d.

The "masked cation exchange" approach according to the present application, applied to Cd chalcogenide films, can be used to create luminescent patterns in NC films, and to fabricate electrical circuit patterns. FIG. 7a shows a Photo Luminescence (PL) image of a NC film where two pads are connected by a straight wire with 10 μm width: here pads and wire consist of $Cu_{2-x}Se/Cu_{2-x}S$, whereas the surrounding material is CdSe/CdS. For these experiments, the samples were kept under air for 24 h prior to measurements. Electrical measurements under ambient conditions were performed with a micromanipulator probe station (Suss) using tungsten micromanipulators as probes. The current was recorded with a Keithley 2612 source-meter. The current measured on the wire connecting the two pads is reported in FIG. 7b by the solid black line, yielding Ohmic conductivity of 250 μS/cm, while the CdSe/CdS regions did not conduct any current above the detection threshold of 1 pA (see dashed line recorded from not-connected pads in FIG. 7b).

Experiments on devices with different wire width and layer thickness showed that the conductance scaled linearly with the wire cross section, as reported in FIG. 7c for different channel widths. The same kind of electrical circuit was obtained via masked cation exchange by e-beam from a different material system, namely, patterns of rod-shaped $Cu_{2-x}S$ NCs obtained via masked exchange on films of CdS nanorods, as shown in FIG. 7d. Here, the initial NC film was prepared by slow solvent evaporation, resulting in film thickness of around 500 nm, and the wire width and length were 2 and 100 μm, respectively. Also in this case we obtained Ohmic behavior for the wire (FIG. 7e), with a conductivity of around 5 S/cm.

Example 4

Sequential Cation Exchange Reactions on NC Films after e-Beam Exposure

Experiments on sequential cation exchange reactions have been performed, using core/shell CdSe/CdS NC films, the electrode pattern reported in the main text, and performed exchange reactions from $Cd^{2+}$ to $Cu^{*+}$ and then from $Cu^{*+}$ to $Pb^{2+}$. The first reaction worked as described above and documented by the confocal fluorescence image recorded in the spectral band from 570-650 nm. For the second exchange step 100 mg of $Pb(NO_3)_2$ were dissolved in 10 ml of methanol, and then 50 μl tributyl phosphate (10% in hexane) were added to the solution. The sample was immersed into this solution for 12 h, and then washed in methanol for 30 min. This experiment offers evidence that sequential exchanges are possible.

We claim:

1. A method for preparing a patterned homogeneous nanocrystal film comprising the steps:
   providing a homogeneous film of organic surfactant ligand coated nanocrystals deposited on a solid support, said nanocrystals comprising a first cation;
   crosslinking the organic ligand on the surface of the nanocrystals by exposing the film to high energy irradiation beam along a predefined pattern; and
   subjecting the so treated film to a cation-exchange reaction with a solution of a chemical species releasing a second cation different from the first cation;
   thereby obtaining a homogeneous film of nanocrystals comprising said second cation, with patterns of nanocrystals comprising said first cation.

2. The method according to claim 1, wherein the nanocrystals comprising the first cation are nanocrystals of a material selected from the group consisting of crystalline metal chalcogenides, oxides, halides, nitrides, or phosphides, and arsenides.

3. The method according to claim 2, wherein the nanocrystals comprising the first cation are nanocrystals of a material selected from the group consisting of a group III-V semiconductor, a IV-VI semiconductor, a II-VI semiconductor, and one material not comprised in the above groups selected from the group consisting of $Cu_2Se$, $Cu_{2-x}Se$, $Cu_{2-x}Se_{1-y}S_y$, $Cu_2S$, $Cu_{2.86}Te$, $Ag_2Se$, $AgSe$, $Ag_2S$, $Ag_2Te$, $CoSe$, $CoSe_2$, $CoS_2$, $CoTe_2$, $Co_3Se_4$, $Co_9S_8$, $ZnSO_4$, $SeS$, $MnSe$, $MnSe_2$, $MnS$, $MnSe_2$, $MnTe_2$, $MnS_{1-y}Se_y$, $MnSe_{1-y}Te_y$, SiC (3C), SiGe, $CuIn_{1-x}Ga_xSe_2$, $Zn_3As_2$, $Li_3NbO_4$, $La_2CuO_4$, $Ga_4Se_8$, $Ga_{1.33}Se_2$, $Mn_xIn_{1-x}As$, $CdxMn_{1-x}Te$, $Mn_{0.4}Pb_{3.6}Te_4$, $CuIn_xGa_{1-x}Se_2$, $CuInSe_2$, $Ag_{0.28}Ga_{2.56}S_4$, and $YF_3$.

4. The method according to claim 1, wherein the nanocrystals comprising said first cation are selected from the group consisting of group II-VI semiconductors CdS, CdSe, CdTe, ZnS, ZnSe, ZnTe, from copper chalcogenides, $Cu_{2-x}S$, $Cu_{2-x}Se$, and $Cu_{2-x}Te$.

5. The method according to claim 1 wherein the organic surfactant ligand coating the nanocrystals surface is selected from the group consisting of alkylphosphines, alkylphosphine-oxides, alkylphosphonic acids, alkylamines, alkylthiols, fatty carboxylic acids or fatty alkanes, arenethiols, fatty alkenes, aromatic compounds, and ethers or mixture thereof.

6. The method according to claim 5, wherein the organic surfactant ligand is selected from the group consisting of trioctylphosphine (TOP), trioctylphosphine oxide (TOPO), octadecylphosphonic acid (ODPA), hexylphosphonic acid (HPA), oleylamine (OLAM), oleic acid (OLAC) hexadecylamine, 1-dodecanethiol, 1-hexadecane thiol, cathecol, oleic acid (OLAC), stearic acid, and arenethiolates.

7. The method according to claim 1, wherein the high energy irradiation is an electron-beam or an X-ray beam or a UV or deep-UV light source.

8. The method according to claim 1, wherein said second cation is selected from the group consisting of elements belonging to group III, group IV, and the transition metal group of the periodic system.

9. The method according to claim 8, wherein said second cation is selected from the group consisting of cationic forms of Cu, Ag, Co, Zn, Se, Mn, Si, Li, La, Cd, Ga, Pb, and Y.

10. The method according to claim 1 further comprising preparing the homogeneous film of nanocrystals, said preparing comprising the step of depositing colloidal nanocrystals on a solid support through spin coating deposition, layer-by-layer deposition, solvent evaporation, Langmuir-Blodgett, capillary-jet deposition, ink-jet printing, dip-pen lithography, drop-casting, doctor-blading, or nanocrystal film self-assembly at liquid subphases.

\* \* \* \* \*